United States Patent
Higo et al.

(10) Patent No.: US 8,416,612 B2
(45) Date of Patent: Apr. 9, 2013

(54) MEMORY AND DATA PROCESSING METHOD

(75) Inventors: Yutaka Higo, Kanagawa (JP); Masanori Hosomi, Kanagawa (JP)

(73) Assignee: Sony Corporation, Tokyo (JP)

( * ) Notice: Subject to any disclaimer, the term of this patent is extended or adjusted under 35 U.S.C. 154(b) by 342 days.

(21) Appl. No.: 12/816,643

(22) Filed: Jun. 16, 2010

(65) Prior Publication Data

US 2010/0328999 A1     Dec. 30, 2010

(30) Foreign Application Priority Data

Jun. 24, 2009    (JP) ............................... P2009-149903

(51) Int. Cl.
*G11C 11/00*     (2006.01)

(52) U.S. Cl.
USPC ........ 365/158; 365/148; 365/171; 365/49.17; 365/189.17; 977/935

(58) Field of Classification Search .................... 365/48, 365/55, 62, 66, 74, 78, 80–93, 100, 130, 365/131, 148, 158, 171–173, 209, 213, 225.5, 365/230.07, 232, 243.5, 49.17, 189.07; 216/22; 257/421, E21.665; 438/3; 428/810–816, 428/817–825.1, 826; 977/933–935
See application file for complete search history.

(56) References Cited

U.S. PATENT DOCUMENTS

| | | | |
|---|---|---|---|
| 5,695,864 A * | 12/1997 | Slonczewski | 428/212 |
| 6,700,809 B1 * | 3/2004 | Ng et al. | 365/49.1 |
| 6,876,559 B1 * | 4/2005 | Rathnavelu et al. | 365/49.1 |
| 7,382,637 B1 * | 6/2008 | Rathnavelu et al. | 365/49.17 |
| 2005/0018519 A1 * | 1/2005 | Nii | 365/227 |

FOREIGN PATENT DOCUMENTS

JP     2003-17782     1/2003

* cited by examiner

*Primary Examiner* — Harry W Byrne
(74) *Attorney, Agent, or Firm* — K&L Gates LLP (57) ABSTRACT

A memory includes: memory devices that each store data of one bit; and a read unit that, by using one predetermined memory device of the memory devices that are included in a memory block having a predetermined unit number of the memory devices as an inversion flag device, reads out data of (the predetermined unit number −1) bits that is written in the other memory devices with the bits being inverted in a case where the data of one bit written in the inversion flag device is a first value representing any one of "0" and "1" and directly reads out the data of (the predetermined unit number −1) bits that is written in the other memory devices in a case where the data of one bit written in the inversion flag device is a second value other than the first value.

9 Claims, 8 Drawing Sheets

CASE WHERE MEMORY ELEMENTS OF TWO BITS ARE DEFECTIVE ELEMENTS

FIG.4B

CASE WHERE MEMORY ELEMENTS OF THREE BITS ARE DEFECTIVE ELEMENTS

MEMORY AND DATA PROCESSING METHOD

CROSS REFERENCES TO RELATED APPLICATIONS

The present application claims priority to Japanese Priority Patent Application JP 2009-149903 filed in the Japan Patent Office on Jun. 24, 2009, the entire content of which is hereby incorporated by reference.

BACKGROUND

The present application relates to a memory and a data processing method that are ideal for a case where data of one bit is stored in a memory device, for example, as any one of "0" and "1".

In related art, as information communication devices, especially, miniaturized electronic devices used particularly in mobile terminals and the like become widely used, it is desirable for devices such as memories or logic circuits configuring the electronic devices to have improved performance such as high-density integration, high operation speed, low power consumption, or the like.

In such miniaturized devices, non-volatile memories are considered to be major components used for improving the functions of the electronic devices. As the non-volatile memory, a semiconductor flash memory, a FeRAM (Ferroelectric non-volatile memory), and the like are practically implemented, and researches and developments for further improving the performance thereof are being actively undertaken.

Recently, as a new non-volatile memory using a magnetic body, for example, there is a device described in U.S. Pat. No. 5,695,864. As described above, developments of magnetic memories utilizing a tunnel magnetoresistive effect have been markedly advanced. Among such magnetic memories, memories having a configuration using magnetization inversion caused by spin transfer have attracted attention.

Here, in JP-A-2003-17782, magnetization inversion caused by spin transfer is described. The magnetic inversion caused by spin transfer is to generate magnetization inversion in a magnetic body by injecting spin-polarized electrons passing through the inside of another magnetic body into the magnetic body.

Accordingly, when the spin-polarized electrons passing through a magnetic layer (magnetization fixed layer) of which the direction of magnetization is fixed are moved into a different magnetic layer of which the direction of magnetization is not fixed, torque is applied to magnetization of the different magnetic layer. Then, by allowing a current having a predetermined threshold value or higher to flow through the different magnetic body, the direction of magnetization of the magnetic layer can be inverted.

For example, a current is allowed to flow through a magnetic tunnel junction device (MTJ device) that has a magnetization fixed layer and a magnetization free layer in a direction perpendicular to the layer faces. Accordingly, the direction of magnetization of at least a part of the magnetic layer of the device can be reversed.

Then, by changing the polarity of the current flowing through the memory device having the magnetization fixed layer and the magnetization free layer (memory layer), the direction of magnetization of the memory layer is reversed, and data is overwritten from "0" to "1" and from 1" to "0". Hereinafter, to write data in a memory device so as to be stored therein may be abbreviated as "writing of data" or "write". In addition, to read out data from the memory device may be abbreviated as "reading out of data" or "read-out".

For reading out of data, stored data can be detected by selecting a memory cell by using a component such as transistor and detecting a difference in directions of magnetization of the memory layer as a difference in a voltage signal by using the tunnel magnetoresistive effect of the memory device.

In the description below, a memory device using a spin transfer is referred to as a SpRAM (Spin transfer Random Access Memory). In addition, a spin-polarized electron stream that causes the spin transfer is referred to as a spin injection current.

SUMMARY

However, in the SpRAM, in order to write data in the memory device, a write current is allowed to flow in the stacked direction of the memory device. At that time, a voltage in the range of about 0.5 V to 1 V is generated across a tunnel insulating layer of the memory device. This voltage is not negligible relative to the breakdown voltage of the tunnel insulating layer. In other words, when a write operation is repeatedly performed, and the tunnel insulating layer receives an electric field stress, there are cases where the tunnel insulating layer is electro-statically broken down. The resistance of such a device is not changed even when a write operation is performed, and the resistance of the memory device of which the tunnel insulating layer is electro-statically broken down decreases markedly. Accordingly, it is difficult to read out data in accordance with a change in the resistance.

In addition, there are also cases where the resistance of the tunnel insulating layer is markedly decreased due to a defect generated in the process of forming the tunnel insulating layer, an initial defect generated in delicately processing the TMR device, or the like. As described above, even in a case where a defect of the low-resistance state is generated in the initial status, it is difficult to read out data in accordance with a change in the resistance or to write data into the device.

Thus, it is desirable to correctly read out data to be written from a memory device in which a defect is generated.

According to an embodiment, one predetermined memory device of memory devices that are included in a memory block having a predetermined unit number of the memory devices each storing data of one bit is used as an inversion flag device.

Next, the data of (a predetermined unit number −1) bits that is written in the other memory devices is read out with the bits being inverted in a case where the data of one bit written in the inversion flag device is a first value representing any one of "0" and "1".

Then, the data of (the predetermined unit number −1) bits that is written in the other memory devices is directly read out in a case where the data of one bit written in the inversion flag device is a second value other than the first value.

Accordingly, even in a case where incorrect data is stored in the memory block, correct data can be read out.

According to an embodiment, there is an advantage in that data can be correctly read out by using the data of the inversion flag device even in a case where it is difficult correctly to read out data from a memory block, for example, due to a defect of a part of the memory devices included in the memory block.

Additional features and advantages are described herein, and will be apparent from the following Detailed Description and the figures.

DETAILED DESCRIPTION

The present application is described below in greater detail with reference to the drawings according to an embodiment.
1. First Embodiment (Write Control: Example of Write Control for Case Where Write Voltage Is Fixed)
2. Second Embodiment (Write Control: Example of Write Control for Case Where Write Voltage Can Be Changed)
3. Modified Examples

1. First Embodiment

Example of Write Control for Case where Write Voltage is Fixed

Hereinafter, a first embodiment of the present invention will be described with reference to FIGS. 1 to 8. In this embodiment (hereinafter, referred to as "this example"), an example in which the present invention is applied to a memory (hereinafter, referred to as SpRAM1) that performs write control in a case where a write voltage is fixed will be described. The SpRAM1 performs write or read of a memory device in accordance with the process described below.

Figure 1:
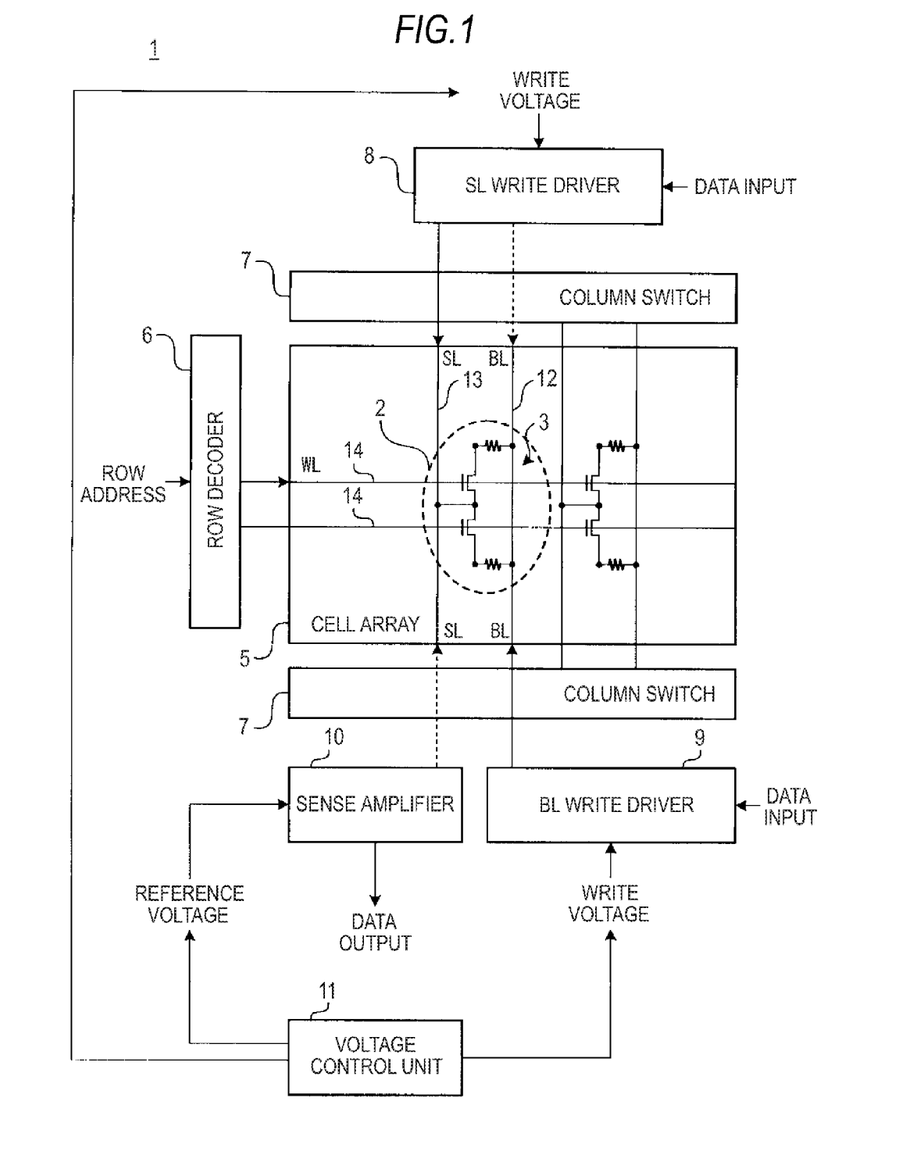
FIG. 1 is a functional block diagram representing an internal configuration example of an SpRAM according to a first embodiment.

FIG. 1 is a functional block diagram representing an internal configuration example of the SpRAM1.

Here, memory devices 2 storing data are disposed in an array shape so as to configure a cell array 5. Each memory device 2 is connected to a bit line 12 (BL) and a source line 13 (SL), which vertically extend on the cell array 5, through a selection MOS transistor 3 and stores data of one bit that is "0" or "1". On the other hand, the gate of the selection MOS transistor 3 is connected to a word line 14 (WL) horizontally extending on the cell array 5.

In FIG. 1, the cell array 5 having the configuration of 4 rows×4 columns is shown. However, in practical applications, the configuration may be scaled up. Thus, for example, the configuration of 512 rows×512 columns may be used. In such a case, the numbers of the word lines 14, the bit lines 12, and the source lines 13 respectively are 512. The left end of each word line 14 is connected to a row decoder 6 that is disposed to the left side of the cell array 5, and the right end thereof is opened. The upper and lower ends of each source line 13 and each bit line 12 are connected to column switches 7 that are disposed to the upper and lower sides of the cell array 5.

In a case where the cell array 5 is configured to have 512 rows×512 columns, the length of the address is 18 bits. Thus, higher-order 9 bits are assigned to a row address, and lower-order 9 bits are assigned to a column address. The row address is input to the row decoder 6, and the column address is input to the column switches 7 disposed on the upper and lower sides.

In addition, the SpRAM1 includes an SL write driver 8 that applies a write voltage to the source line 13 and a BL write driver 9 that applies a write voltage to the bit line 12. Both the SL write driver 8 and the BL write driver 9 serve as a write unit that writes data into the memory device 2. In a case where a first value (in this example, "1") that represents any one of "0" and "1" is written in an inversion flag device to be described later, the write unit performs bit inversion for data of (a predetermined unit number −1) bits and stores the data in a different memory device. On the other hand, in a case where a second value (in this example, "0") that is different from the first value is written in the inversion flag device, the write unit writes the data of (the predetermined unit number −1) bits without any change in a different memory device by using the SL write driver 8 and the BL write driver 9. A write voltage used by the write unit for writing data into a memory block and a reference voltage supplied to a sense amplifier 10 are controlled by the voltage control unit 11.

In addition, the SpRAM1 includes the sense amplifier 10 which is connected to the source line 13 and to which a sense voltage that is used for allowing a current read out from the memory device 2 to flow is input. One memory device 2 stores data of one bit, and a reference voltage having a predetermined level is input to the sense amplifier 10. The sense amplifier 10 reads out the data written in the memory device 2 by comparing the sense voltage and the reference voltage together. The sense amplifier 10 of this example serves as a read unit that reads out data from the memory device 2.

The sense amplifier 10 of this example uses one predetermined memory device 2 included in a memory block having a predetermined unit number of the memory devices 2 as the inversion flag device (see FIGS. 4A and 4B to be described later). In a case where the one-bit data written into the inversion flag device is a first value (in this example, "1") that represents any one of "0" and "1", the sense amplifier 10 reads out the data of (a predetermined unit number −1) bits written into a different memory device 2 with the bits inverted. On the other hand, in a case where the one-bit data written into the inversion flag device is a second value (in this example, "0") that is different from the first value, the sense amplifier 10 directly reads out the data of (the predetermined unit number −1) bits written into a different memory device 2. Accordingly, even when a part of the data written into the memory block is erroneous, the sense amplifier 10 can correct the error.

Next, an example of the internal configuration of a memory cell of the memory (SpRAM1) using spin transfer will be described.

Figure 2:
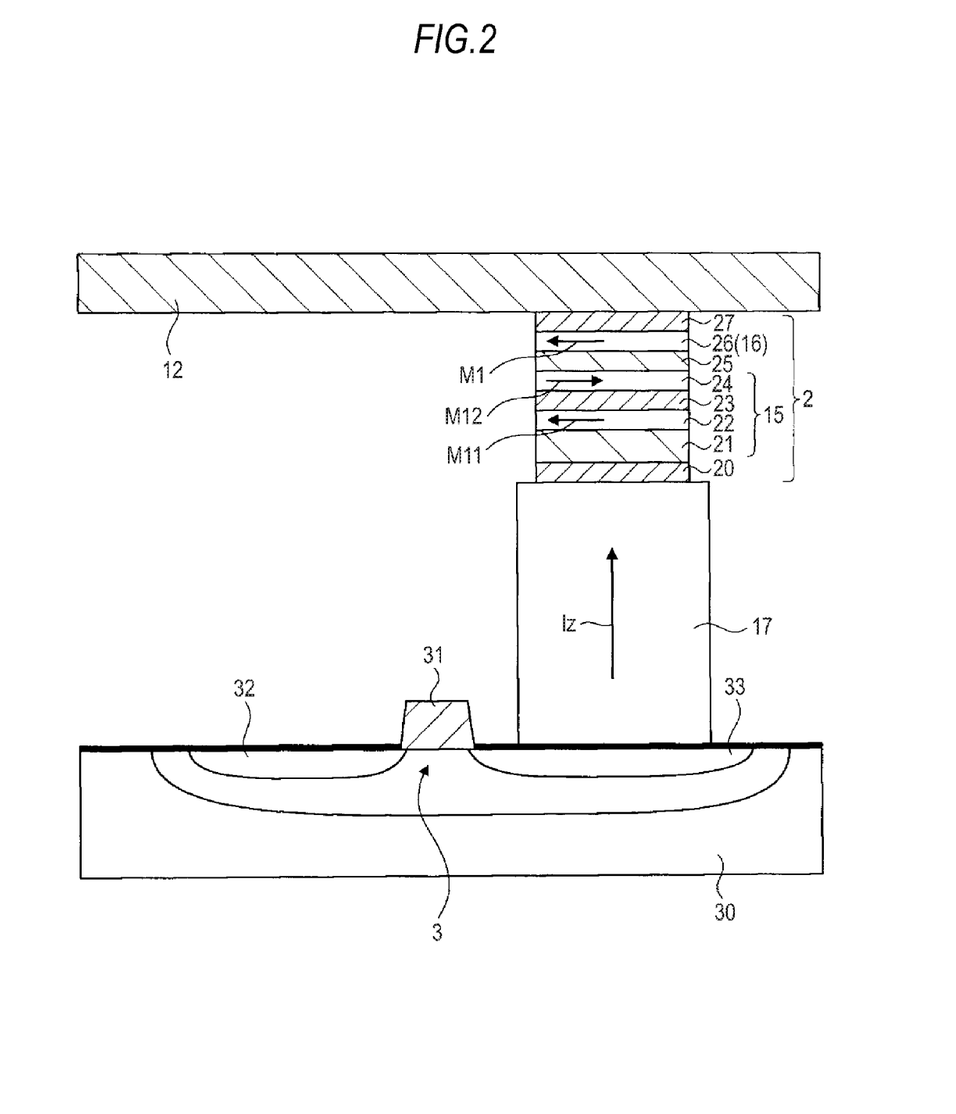
FIG. 2 is a schematic cross-sectional view of a memory cell of a memory, which uses a spin transfer, according to the first embodiment.

FIG. 2 represents a schematic cross-sectional view of a memory device 2 and a memory cell.

The entire structure represented in FIG. 2 shows the memory cell. In order to select electrically a memory cell for reading out data stored in the memory device 2, a diode, an MOS transistor, or the like may be used. The memory cell of this example uses an MOS transistor.

First, a configuration example of the memory cell will be described.

A ferromagnetic layer 22 and a ferromagnetic layer 24 are disposed with a nonmagnetic layer 23 interposed therebetween, thereby forming antiferromagnetic coupling. In addition, the ferromagnetic layer 22 disposed on the lower layer side is disposed so as to be brought into contact with an anti-ferromagnetic layer 21. Accordingly, the ferromagnetic layer 22 has strong magnetic anisotropy for one direction due to exchange interaction working between the above-described layers. A magnetization fixed layer 15 is configured by the above-described layers 21, 22, 23, and 24. In other words, the magnetization fixed layer 15 has two layers of the ferromagnetic layers 22 and 24.

A ferromagnetic layer 26 is configured such that the direction of magnetization M1 thereof can be relatively easily rotated, and a memory layer (magnetization free layer) 16 is configured by the ferromagnetic layer 26. The memory layer 16 stores data as the magnetization state of the magnetic body.

Between the ferromagnetic layer 24 of the magnetization fixed layer 15 and the ferromagnetic layer 26, that is, between the magnetization fixed layer 15 and the memory layer 16, a tunnel insulating layer 25 is formed. This tunnel insulating layer 25 has a function for cutting the magnetic coupling of the upper and lower ferromagnetic layers 26 and 24 and allowing a tunnel current to flow. Accordingly, a TMR (tunnel magnetoresistive effect) device is configured by the magnetization fixed layer 15 in which the magnetization direction of the magnetic layer is fixed with the nonmagnetic layer 23 interposed between the memory layer 16 and the magnetization fixed layer 15, the tunnel insulating layer 25, and the memory layer 16 of which the magnetization direction can be changed.

As described above, the memory device 2 that is formed from the TMR device by the above-described layers 21 to 26, a basic film 20, and an overcoat layer 27 is configured.

The memory device 2 can store data in the memory layer 16 by applying a write current flowing in the stacked direction so as to change the magnetization direction of the memory layer 16.

The material of each layer configuring the memory device 2 is as follows.

As the material of the antiferromagnetic layer 21, for example, PtMn can be used.

As the material of the ferromagnetic materials 22 and 24 of the magnetization fixed layer 15, a ferromagnetic material such as CoFe can be used.

As the material of the nonmagnetic layer 23, for example, Ru, Ta, Cr, Cu, or the like can be used.

As the material of the tunnel insulating layer 25, for example, MgO can be used.

As the material of the ferromagnetic layer 26 of the memory layer 16, a ferromagnetic material such as CoFeB can be used.

In a silicon substrate 30, the selection MOS transistor 3 is formed. A connection plug 17 is formed on a diffusion layer 33 that is disposed on one side of the selection MOS transistor 3. To the connection plug 17, the basic film 20 of the memory device 2 is connected. A diffusion layer 32 disposed on the other side of the selection MOS transistor 3 is connected to a source line 13 through a connection plug not shown in the figure. The gate 31 of the selection MOS transistor 3 is connected to the word line 14 through a connection plug not shown in the figure. The overcoat layer 27 of the memory device 2 is connected to the bit line 12 that is disposed thereon.

In a normal state, the magnetization M11 of the ferromagnetic layer 22 and the magnetization M12 of the ferromagnetic layer 24 are in an approximately complete antiparallel state due to antiferromagnetic coupling through the nonmagnetic layer 23.

Commonly, the ferromagnetic layer 22 and the ferromagnetic layer 24 have the magnetic moment of a similar configuration. Accordingly, the leakage component of magnetic fields at magnetic poles is negligibly small.

The resistance value of the TMR device that is configured by the layers 24, 25, and 26 changes depending on whether the direction of the magnetization M1 of the ferromagnetic layer 26 of the memory layer 16 and the direction of the magnetization M12 of the ferromagnetic layer 24 of the magnetization fixed layer 15, which have the tunnel insulating layer 25 interposed therebetween, is in the parallel state or the antiparallel state. In the state in which two magnetizations M1 and M12 are in the parallel state, the resistance value decreases. On the other hand, in the antiparallel state, the resistance value increases. When the resistance value of the TMR device changes, the resistance value of the entire memory device 2 is also changed. By utilizing the above-described phenomenon, data can be written into or read out from the memory device 2. For example, binary data (one bit) can be written by assigning the state having the low resistance value to data "0" and assigning the state having the high resistance value to data "1".

In addition, the ferromagnetic layer 24 of the magnetization fixed layer 15 that is disposed on the memory layer 16 side is a ferromagnetic layer that is referred to as the reference of the direction of the magnetization M1 of the memory layer 16 when stored data is read out. Thus, the ferromagnetic layer 24 is also referred to as a "reference layer".

In order to rewrite data of a memory cell or read out data written in a memory cell, a spin injection current Iz is allowed to flow. This spin injection current Iz passes through the diffusion layer 33, the memory device 2, and the bit line 12.

When the polarity of the spin injection current Iz is changed, the direction of the spin injection current Iz flowing through the memory device 2 can be changed from the upward direction to the downward direction or from the downward direction to the upward direction.

Accordingly, the direction of the magnetization M1 of the memory layer 16 is changed, whereby the data of the memory cell can be overwritten.

Next, an example of a data writing operation that is performed by the write unit will be described.

The row decoder 6 sets the voltage of one of 512 word lines 14 to a power source voltage in accordance with a row address and turns on the selection MOS transistor 3 that is connected to the corresponding word line 14. The column switch 7 disposed on the upper side connects one of 512 source lines 13 to the SL write driver 8 in accordance with a column address. The column switch 7 disposed on the lower side connects one of 512 bit lines 12 to the BL write driver 9 in accordance with the column address.

The SL write driver 8 outputs the write voltage when the data input is "1". On the other hand, the SL write driver 8 outputs GND when the data input is "0". On the contrary, the BL write driver 9 outputs the write voltage when the data input is "0". On the other hand, the BL write driver 9 outputs GND when the data input is "1". Accordingly, the direction of the current is changed in accordance with the data input, whereby data of "0" or "1" can be written into the selected memory device 2.

Next, an example of a data reading operation that is performed by the sense amplifier 10 will be described.

The selection of the word line 14 is the same as that for data writing. The column switch 7 disposed on the upper side connects one of 512 bit lines 12 to the SL write driver 8 in accordance with the column address. The column switch 7 disposed on the lower side connects one of 512 source lines 13 to the sense amplifier 10 in accordance with the column address. The SL write driver 8 typically outputs GND. Accordingly, a constant read current is allowed to flow from the sense amplifier 10 to the selected memory device 2.

In a case where the state of the memory device 2 is "1", that is, in the case of a high resistance state, the sense voltage used for allowing the read current to flow is assumed to be V1. Similarly, in a case where the state of the memory device 2 is "0", that is, in the case of a low resistance state, the sense voltage used for allowing the read current to flow is assumed to be V0. At this time, V1>V2 due to the magnitude relation of resistance values. Thus, a reference voltage that is lower than V1 and is higher than V2 is input to the sense amplifier 10.

The sense amplifier 10 compares the sense voltage and the reference voltage together. Here, in the case of "sense voltage>reference voltage", the corresponding memory device 2 can be determined to be in a state in which "1" is stored therein. On the other hand, in the case of "sense voltage<reference voltage", the corresponding memory device 2 can be determined to be in a state in which "0" is stored therein. In other words, the data reading operation can be performed.

As described above, the SpRAM1 takes one of the high resistance state and the low resistance state in accordance with the data stored in the memory device. In this example, the high resistance state is denoted by "1", and the low resistance state is denoted by "0". At this time, it can be noticed that both the static breakdown of the tunnel insulating layer and an initial low resistance defect that are major defect factors of the SpRAM1 markedly decrease the resistance value of the memory device.

In a case where a read operation is performed by the sense amplifier 10, the output value is determined based on the magnitude comparison of the resistance value with the reference resistance value. Accordingly, the memory device 2 typically outputs "0".

In other words, in a case where a read operation is performed after "0" is written into the memory device 2, the resistance is not changed in accordance with the write operation. However, as a result, the sense amplifier 10 can correctly read out "0".

On the contrary, in a case where a read operation is performed after "1" is written into the memory device 2, the resistance is not changed in accordance with the write operation. Accordingly, the sense amplifier 10 typically reads out "0" incorrectly. On the premise of the description presented above, next, an example of a reading process using the inversion flag device 41 that is performed by the SpRAM1 of this example will be described.

Figures 3A, 3B:
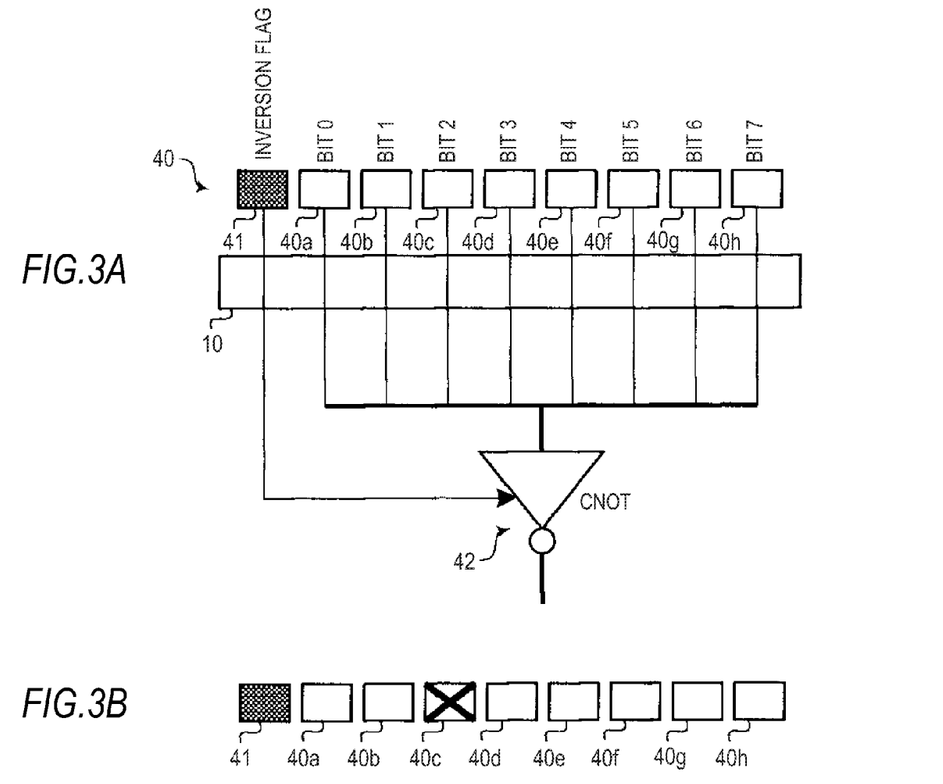
FIGS. 3A, 3B, and 3C are schematic diagrams of a memory block configuring a memory according to the first embodiment.
Figure 3C:
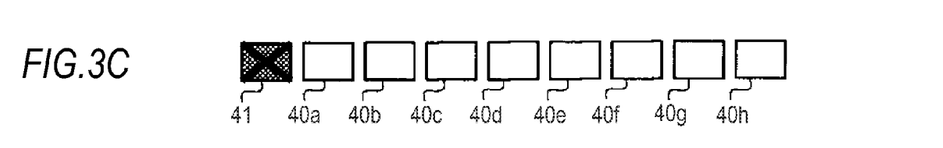

FIGS. 3A, 3B, and 3C show an example of a memory block 40 having a plurality of the memory devices 2.

FIG. 3A is a schematic diagram showing an example of a data unit relating to a read operation.

The sense amplifier 10 performs a read operation with data devices 40a to 40h storing 8 bit data therein and one bit inversion flag device 41 used as the memory block 40 of one unit. In this example, the memory block 40 is configured by 9 memory devices 2 with 9 bits being used as one unit. Accordingly, when one specific memory device 2 is used as the inversion flag device 41, data of 8 bits acquired by decreasing one bit from 9 bits is stored in the other memory devices 2.

In the read operation, first, the sense amplifier 10 reads out all the bits and passes the bits through a CNOT (Controlled NOT) circuit 42. Next, when the inversion flag device 41 is "0", the data of the data devices 40a to 40h is output without any change from the CNOT circuit 42. On the other hand, when the inversion flag device 41 is "1", data acquired by shifting all bits of the data devices 40a to 40h from "0" to "1" and from "1" to "0" is output from the CNOT circuit 42.

FIG. 3B shows a case where the data device 40c corresponding to bit "2" is a defective device.

In such a case, while data of any one of "0" and "1" is correctly written in the data devices 40a, 40b, and 40d to 40h other than the data device corresponding to bit "2", the data device 40c corresponding to bit "2" is typically in the state of "0". Accordingly, in a case where data to be written into the data device 40c corresponding to bit "2" is "0", the original data is written into the data devices 40a to 40h corresponding to bit "0" to bit "7", and "0" is written into the inversion flag device 41. Thus, correct data can be read out by using the above-described read method.

Next, in a case where data to be written into the data device 40c corresponding to bit "2" is "1", data acquired by shifting to "0" from "1" and to "1" from "0" is written into the data devices 40a to 40h corresponding to bit "0" to bit "7", and "1" is written into the inversion flag device 41. At this time, the data written into the data device 40c corresponding to bit "2" is converted into "0" so as to coincide with the state of bit "2" that is "0". At the time of reading the data, since the inversion flag device 41 is "1", the data written into the data devices 40a to 40h is shifted from "0" to "1" and from "1" to "0" again, whereby data can be reproduced and read out correctly.

FIG. 3C shows a case where the inversion flag device 41 is a defective device.

A defective device may be generated in any of the memory devices (the data devices 40a to 40h and the inversion flag device 41) on an equal basis. Thus, there is a case where the inversion flag device 41 is a defective device. In such a case, the inversion flag device 41 is fixed to "0". Accordingly, at the time of reading the data, data of bit "0" to bit "7" is output from the CNOT circuit 42 without any change. Accordingly, as long as all the data devices 40a to 40h of bit "0" to bit "7" are normal, a read operation and a write operation can be correctly performed.

Figure 4A:
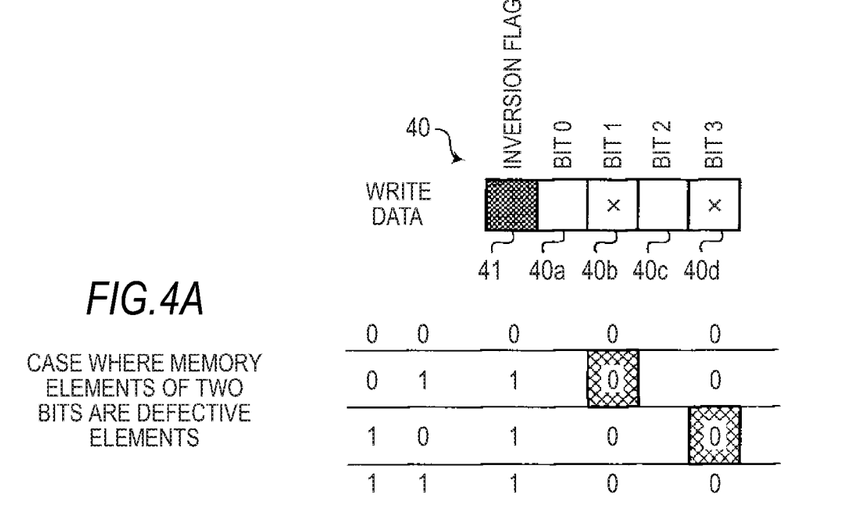
FIGS. 4A and 4B are diagrams representing the relationship between written data and defective portions in cases where there are two or three defective devices, according to the first embodiment.
Figure 4B:
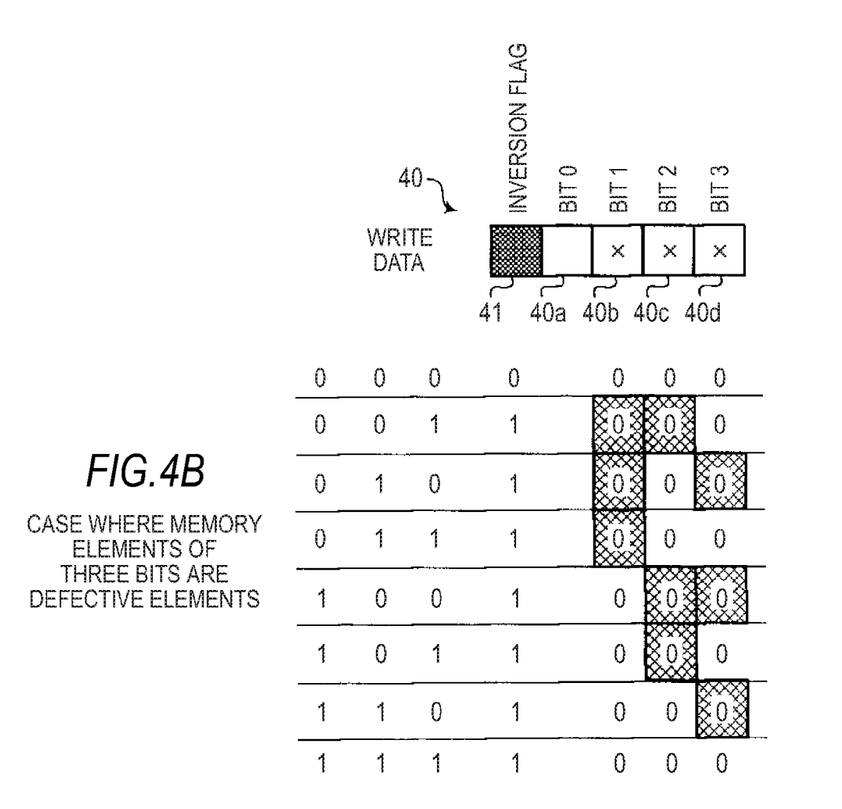

FIGS. 4A and 4B show cases where two or more bits of memory devices from among memory devices of 4 bits are defective devices.

FIG. 4A shows a case where two bits of the memory devices are defective devices.

FIG. 4B shows a case where three bits of the memory devices are defective devices.

There are 2×2=4 patterns or 2×2×2=8 patterns of data to be written into the data devices 40a to 40h.

The inversion flag device 41 is set to "0" in a case where "0" is written into all the defective devices, and the inversion flag device 41 is set to "1" in a case where "1" is written into all the defective devices. Accordingly, a read operation and a write operation can be performed without any problem.

However, in a case where data in which "0" and "1" are mixed is written, the sense amplifier 10 does not correctly read out at least one or more bits regardless of the inversion flag device 41. Here, in FIGS. 4A and 4B, portions of which the grounds are colored in gray are bits that are not correctly read out. A maximum number of bits that are not correctly read out is "1" in a case where two bits are defective devices, and is "2" in a case where three bits are defective bits.

Generally, (the number of defective devices −1) bits remain as defective bits for which it is difficult to perform a read operation and a write operation. Here, in a case where the inversion flag device 41 is included in the defective devices, bits other than the defective inversion flag device 41 become defective bits. Thus, similarly, (the number of defective devices −1) bits remain as defective bits. As described above, according to the SpRAM1 of this example, there is an advantage in that the number of bits influenced by error, which occurs in a write operation or a read operation for data due to defective devices generated in the memory block 40, is decreased by one from the number of defective devices, by using the inversion flag device 41.

In this example, in order to read out data from the SpRAM1, an error correction code (ECC) may be used together. Any type of the error correction code (ECC) may be used. For example, a (12, 8) code may be used. The (12, 8) code represents encoding 8 bit data into a 12 bit code. In such a case, an error of 1 bit out of 12 bits is detected and corrected, and then, the data is decoded into 8 bit data. The structure of the above-described encoding and decoding method, for example, is described in the technical literature in "A Systematic (12,8) Code for Correcting Single Errors and Detecting Adjacent Errors, Jay W. Schwartz and Jack Keil Wolf, IEEE Transactions on Computers, Volume 39, Issue 11 (1990) Pages: 1403-1404".

Figure 5:
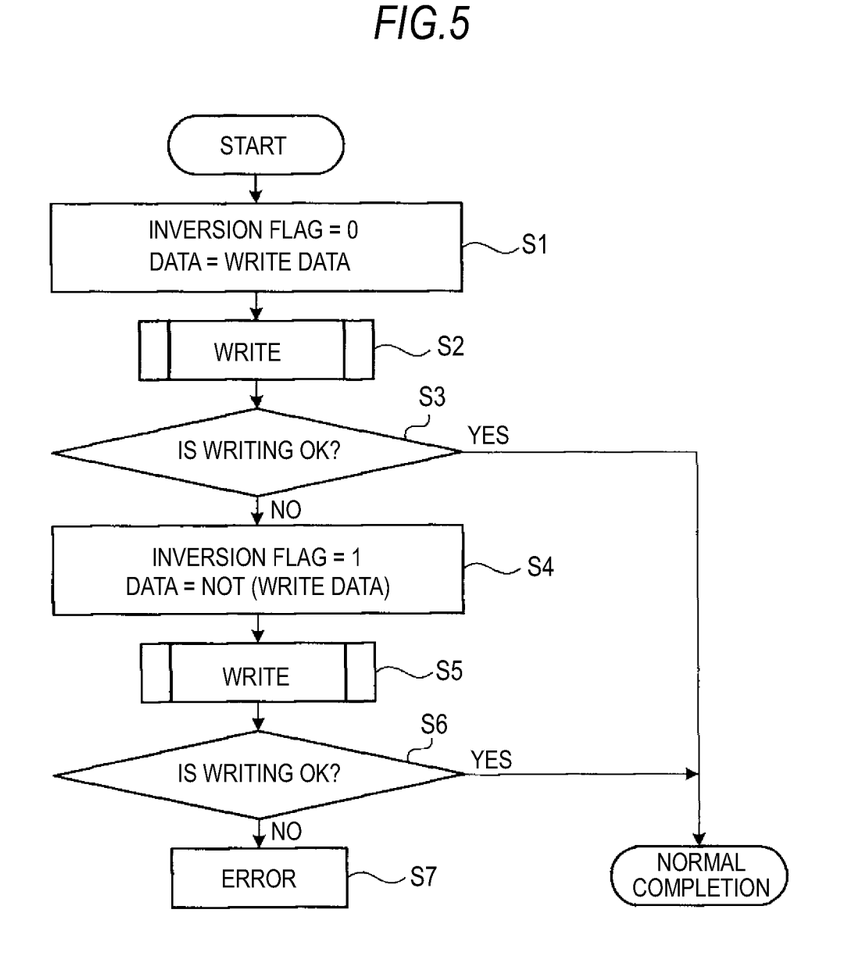
FIG. 5 is a flowchart of a writing method according to the first embodiment.

FIG. 5 represents a flowchart for a case where data is written in the memory devices 2.

Generally, the ratio of defective devices (defective device rate) to the memory devices 2 included in the SpRAM1 is low. Accordingly, first, the write unit tries to write data into the memory block 40 in accordance with a write voltage supplied from the voltage control unit 11 without using the inversion flag device 41 (Step S1). In other words, in a case where the write unit writes data into the memory block for the first time, data to be written into the inversion flag device 41 is set to "0", and data to be written into the data devices 40a to 40h is set without any change.

Next, the write unit performs an actual write operation for the memory block 40 in accordance with the write voltage supplied from the voltage control unit 11 (Step S2). Next, the sense amplifier 10 reads out 8 bit data from the data devices 40a to 40h (Step S3) and determines whether or not the 8 bit data is correctly written into the data devices 40a to 40h.

At this time, the sense amplifier 10 performs a read operation by using a predetermined one memory device as the inversion flag device 41 that is included in a memory block that has a predetermined unit number of the memory devices storing one bit data. Then, since one bit data written into the inversion flag device 41 is a second value ("0"), the sense amplifier 10 directly reads out data of (the predetermined unit number −1) bits (in this example, data of 8 bits) written in the other memory devices. When verifying that the data of 8 bits is written in the memory devices 2, the sense amplifier 10 completes the write operation.

When determining that data of one bit or more is not correctly written, the sense amplifier 10 determines that there is a defective device in the memory block 40 and then proceeds to a write operation using the inversion flag device 41. In other words, the sense amplifier 10 sets data to be written into the inversion flag device 41 to "1" and sets data to be written into the data devices to data acquired by shifting to "1" from "0" and to "0" from "1" in the desired data (Step S4).

Again, the write unit actually writes data into the memory block 40 in accordance with the write voltage supplied from the voltage control unit 11 (Step S5). In other words, the write unit is directed to perform a write operation at least once or more by setting the data to be written into the inversion flag device 41 to "1" and performing bit inversion for the data to be written into the data devices 40a to 40h.

Here, the write voltage that is used in the writing of data into the memory block 40 in Steps S2 and S5 is fixed. Next, the sense amplifier 10 performs a read operation and completes the write operation at a time when the data of 8 bits is correctly written (Step S6).

At this time, since the one bit data written into the inversion flag device is the first value ("1"), the sense amplifier 10 reads out the data of (predetermined unit number −1) bits written in the other memory devices with the bits being inverted.

In a case where the data is not written (Step S7), the writing of correct data is determined to be given up, and aid using the error correcting code (hereinafter, referred to as ECC: Error Correcting Code) is expected. In addition, in a case where the number of bits that are not correctly written at a time when the inversion flag device 41 is "0" is smaller than the number of bits that are not correctly written at a time when the inversion flag device 41 is "1", the inversion flag device 41 is set to "0" again. Then, the data desired to be written is set without any change, and the data can be written into the data devices 40a to 40h.

A method of writing data considering the SpRAM1 has been described as above. However, in a case where the method is applied to a memory of a different type, the "write voltage" is appropriately changed to the amount of a write operation that is matched up to the applied memory.

Figure 6:
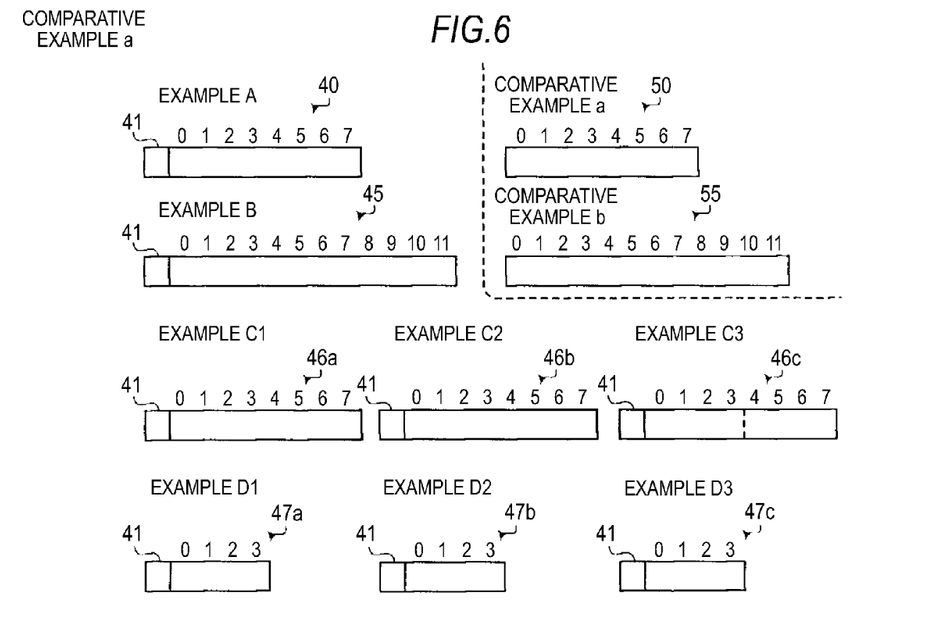
FIG. 6 represents diagrams showing memory blocks according to the first embodiment and memory blocks of comparative examples.

Hereinafter, a configuration example of a memory block to which the inversion flag device 41 of this example is added will be described with reference to a comparative example of a general memory block. Here, the probability of occurrence of a defective device is denoted by r, and a function defined in the following Equation (1) is appropriately used. In the following Equation (1), f(n, m, r) represents the probability of occurrence of error of m bits out of n bits. In addition, F(n, s, r) represents the probability of occurrence of error of (s+1) bits or more out of n bits. As described above, the variable s represents the degree of the number of erroneous bits.

$$f(n, m, r) = \binom{n}{m} r^m (1 - r)^{n-m} \quad (1)$$

$$F(n, s, r) = \sum_{m=s+1}^{n} f(n, m, r)$$

Comparative Example a

A memory block 50 shows a structural example of a general memory block that does not use an ECC.

The memory block 50 is configured by data devices of 8 bits and can store data of net 8 bits therein. However, even when a defect occurs in one bit out of the data devices of 8 bits, the entire data devices of 8 bits do not correctly operate. Here, the block defect rate (the rate of defect of the memory device included in the memory block) of the memory block 50 is represented as $1-(1-r)^8=F[8, 0, r]$.

Comparative Example b

A memory block 55 shows a structural example of a general memory block that uses an ECC.

The memory block 55 is configured by data devices of 12 bits and can store data of net 8 bits therein. However, when defects of 2 bits or more out of 8 bits occur, the entire data devices of 12 bits do not correctly operate. Here, the block defect rate of the memory block 55 is represented as F[12, 1, r].

Example A

A memory block 40 shows a structural example of a memory block according to an embodiment of the present invention in a case where an ECC is not used.

The memory block 40 is configured by data devices of 8 bits and an inversion flag device 41 of one bit and can store data of net 8 bits therein. As described above, since the error correcting capability is improved by one bit by using the inversion flag device 41, the block defect rate of the memory block 40 is represented as F[9, 1, r].

Example B

A memory block 45 shows a structural example of a memory block according to an embodiment of the present invention in a case where an ECC is used.

The memory block 45 is configured by data devices of 12 bits and an inversion flag device 41 of one bit and can store data of net 8 bits therein. As described above, since the error correcting capability is improved by one bit by using the inversion flag device 41, the block defect rate of the memory block 45 is represented as F[13, 2, r].

Examples C1 to C3

In order to design a memory device (SpRAM1), the data width is preferably a power of two. Thus, it may be considered to divide 8×3=24 bits into two portions to be associated with two values of code data of 12 bits.

Examples C1 to C3 show structural examples of memory blocks according to embodiments of the present invention of such a case.

Each of three memory blocks 46a to 46c is configured by data devices of 8 bits and an inversion flag device 41 of one bit. Here, data of net 8 bits is stored in the memory blocks 46a and 46b by configuring code data of 12 bits by using the data devices of the memory block 46a and the lower-order 4 bits of the memory block 46c. Accordingly, error of one bit out of 12 bits that are configured by the memory block 46a and the lower-order 4 bits of the memory block 46c can be corrected by using the ECC.

Similarly, data of net 8 bits is stored in the memory blocks 46b and 46c by configuring code data of 12 bits by using the data devices of the memory block 46b and the higher-order 4 bits of the memory block 46c. Consequently, data of 16 bits is stored in the memory blocks 46a to 46c.

Figure 7:
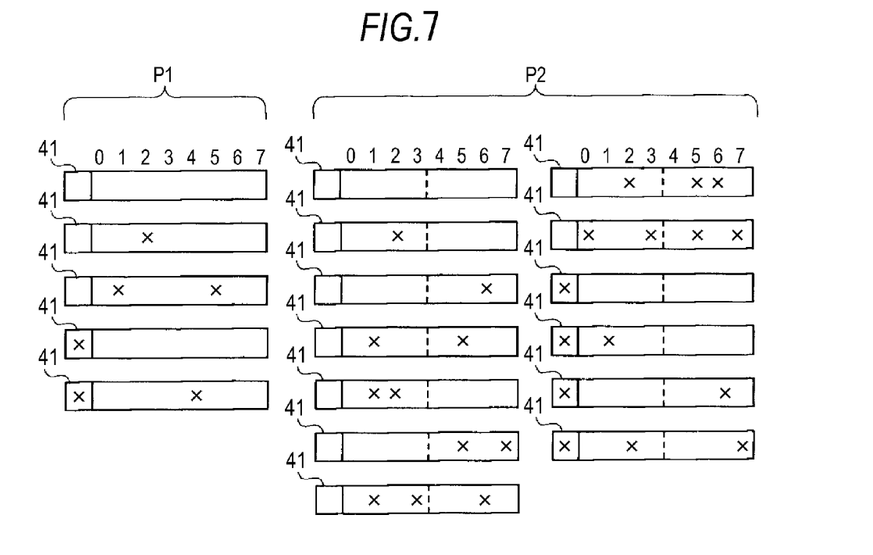
FIG. 7 represents examples of defective patterns according to examples of the first embodiment.

FIG. 7 shows examples of the disposition of defective devices that are allowed in a case where the memory blocks 46a to 46c are used.

As examples of the defective patterns of the occurrence of defects in the data devices, there are a defective pattern P1 for the memory blocks 46a and 46b and a defective pattern P2 for the memory block 46c.

In the defective patterns P1 and P2, the influence of the defect of the data device included in each data block is equal to or smaller than one bit by including the inversion flag device 41 in each memory block. The number of the defective pattern P1 is 5, and the number of the defective pattern P2 is 13. Thus, there are 5×5×13=325 combinations of all the patterns. However, by excluding cases where the number of defects after being brought into code data of 12 bits is equal to or greater than two bits, there are 233 combinations of the numbers of all the patterns. Here, 233 combinations represent a result acquired by counting corresponding patterns among all the patterns acquired by executing a calculation program in a computer. Then, by calculating the probability r of generation of a defective device for all the possible cases, the block defect rate can be calculated. However, for comparison with another example, the block defect rate is converted into a value per net 8 bits.

Examples D1 to D3

The memory blocks 47a to 47c are acquired by further subdividing the memory blocks 46a to 46c relating to actual examples C1 to C3. Each of all the three memory blocks 47a to 47c is configured by a data device of 4 bits and the inversion flag device 41 of one bit. In such a case, data of net 8 bits is stored in the memory blocks 47a to 47c by forming code data of 4×3=12 bits. By storing the data as described above, similarly to the actual examples C1 to C3, the block defect rate for all the possible cases can be calculated.

Figure 8:
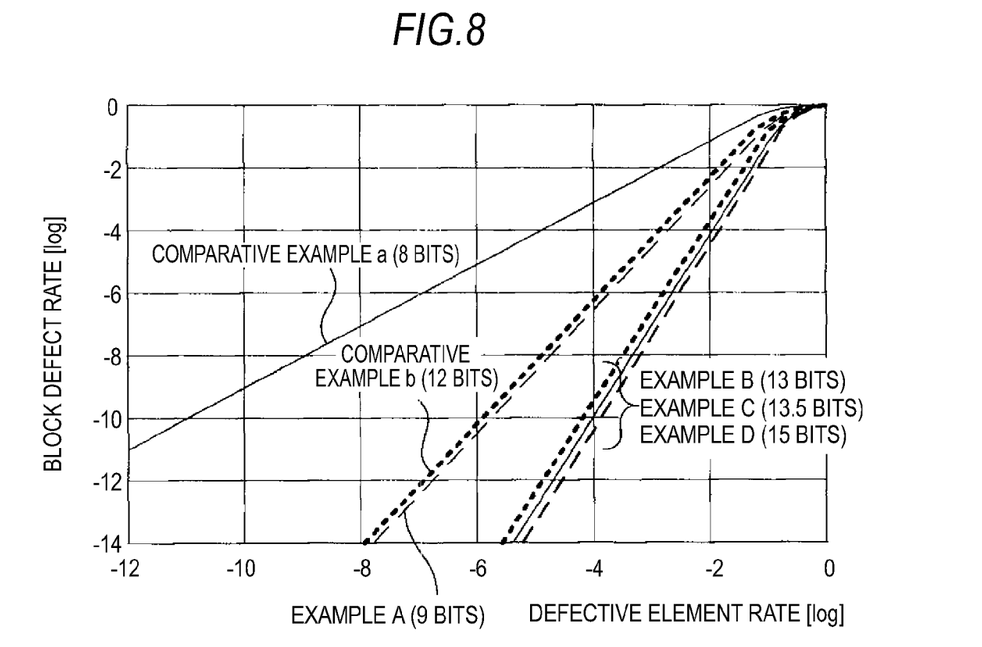
FIG. 8 is a diagram showing the calculated relationship between a device defect rate and a block defect rate according to the first embodiment.

Next, the block defect rate for a case where the memory block according to each example is used will be verified.

A curve shown in FIG. 8 shows the relationship of the block defect rate with respect to the defect device rate r that is acquired from the above-described comparative examples a and b, and Examples A, B, C1 to C3 and D1 to D3.

The numeric value in each of the drawings represents the number of memory devices per data of 8 bits in the Comparative Examples a and b and Examples A, B, C1 to C3, and D1 to D3.

Each curve can be approximated to a straight line in an area having the low defect device rate r, and the slope thereof depends on the error correcting capability. In other words, the memory block 50 shown in Comparative Example a in which the error correcting capability is not included is represented to have the slope of "1". On the other hand, the memory block 55 shown in Comparative Example b having the error correcting capability of "1" and the memory block 40 shown in Example A are represented to have the slope of "2". In addition, the memory blocks 45, 46a to 46c, and 47a to 47c shown in Examples B, C, and D, which have the error correcting capability of "2", are represented to have the slope of "3". Accordingly, as the error correcting capability is increased, the block defective rate rapidly decreases together with the defective device rate r.

Here, by comparing the curve corresponding to Comparative Example b and the curve corresponding to Example A to each other, it can be known that the block defect rate of the memory block 40 according to Example A is superior to that of the memory block 55. In addition, when the numbers of the memory devices per data of 8 bits of the memory blocks 40 and 55 are compared to each other, the number of the memory devices included in the memory block 55 according to Comparative Example b is "12", and the number of the memory devices included in the memory block 40 according to Example A is "9", which is ¾ of the number of the memory devices included in the memory block 55. This is advantageous for decreasing the area occupied by the memory devices 2 in the SpRAM1. Accordingly, in a case where there are only the defective devices of "0", it can be said that use of the inversion flag device 41 according to an embodiment of the present invention that is added to a memory block is more advantageous than use of an ordinary ECC.

In addition, by combining the technology according to an embodiment of the present invention with the ECC, as represented by the block defect rates of the curves corresponding to Examples B, C1 to C3, and D1 to D3, more improved error correction can be implemented. In such a case, the block defect rates are enhanced in the order of the memory blocks 45, 46a to 46c, and 47a to 47c according to Examples B, C1 to C3 and D1 to D3. Here, in the memory blocks 46a to 46c and 47a to 47c according to Examples C1 to C3 and D1 to D3, the data width is the power of two, and accordingly, the block structure is advantageous for memory design.

According to the above-described SpRAM1 of the first embodiment, in a case where error correction is made by using the memory block to which the inversion flag device 41 is added and in a case where the output of the defective device is "0", the sense amplifier 10 can correctly read out data. On the other hand, also in a case where the output of the defective device is "1", the data can be correctly read out by correcting the interpretation of the inversion flag device 41 by using the sense amplifier 10. Accordingly, in a case where data is written by using the inversion flag device 41, the same as in this example, there is an advantage in that the possibility of erroneous reading out data due to the defective device can be markedly decreased by reading out data from the memory block based on the data of the inversion flag device 41.

2. Second Embodiment

Example of Write Control for Case where Write Voltage can be Changed

Next, a second embodiment according to an embodiment will be described.

In this example, a case in which the present invention is applied to a memory that performs write control in a case where the write voltage can be changed will be described. In the description below, to each portion corresponding to FIGS. 1 and 3 described in the first embodiment, the same reference sign is assigned, and detailed description thereof is omitted.

In the SpRAM1 of this example, a read unit (in this example, a sense amplifier 10) determines whether or not writing of data is successful based on the value of a voltage output from the memory device 2. When the sense amplifier 10 determines success in the writing of data in the middle of the process, the voltage control unit 11 stops application of the write voltage to the memory device 2. On the other hand, when the sense amplifier 10 determines a failure in the writing of data, the sense amplifier 10 directs the voltage control unit 11 to increase the write voltage.

In particular, in a case where data is written into the memory block for the first time, the sense amplifier 10 writes a second value (in this example, "0") into the inversion flag device and writes data of (a predetermined unit number −1) bits without any change into the other memory devices. Then, the sense amplifier 10 directly reads out the data of (the predetermined unit number −1) bits written into the other memory devices from the memory block. In a case where the sense amplifier 10 determines that the data of (the predetermined unit number −1) bits is correctly written into the other memory devices as the result of the reading out of the data, the sense amplifier 10 completes writing of data that is performed by the write unit.

On the other hand, when determining that data of one bit or more is not correctly written, the sense amplifier 10 directs the write unit to perform operations described below. In other words, the sense amplifier 10 directs the write unit to write a first value (in this example, "1") into the inversion flag device and to invert the data of (the predetermined unit number −1) bits and write the inverted data into the other memory devices at least once or more.

Then, the sense amplifier 10 directly reads out the data of (the predetermined unit number −1) bits written into the other memory devices from the memory block. In a case where the sense amplifier 10 determines that data of one bit or more is not correctly written as the result of the reading out of the data, the sense amplifier 10 directs the voltage control unit 11 to increase the write voltage and directs the write unit to write the data again.

Figure 9:
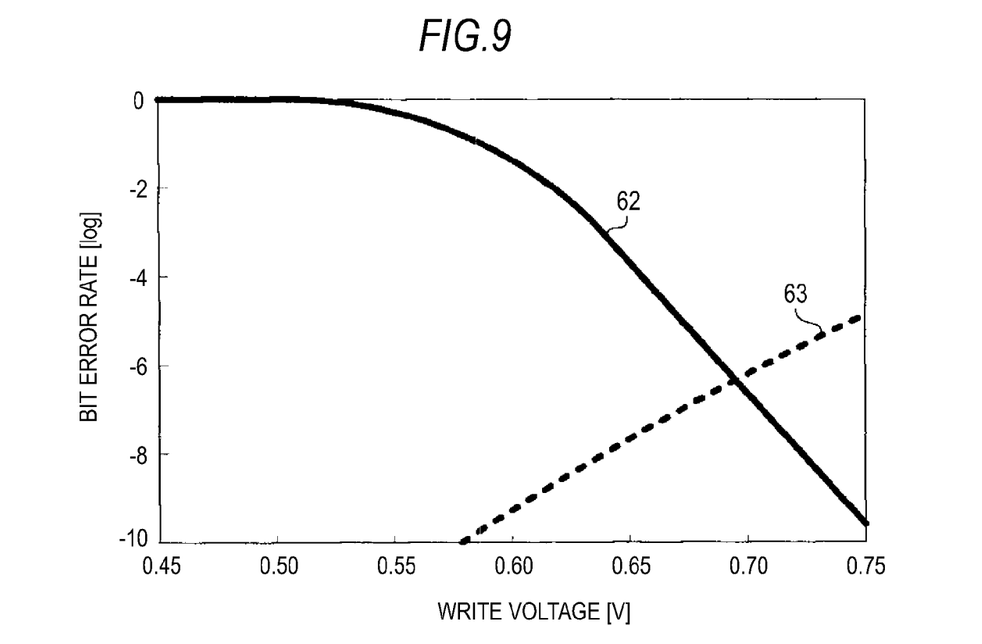
FIG. 9 is a schematic diagram illustrating an example of calculated results of a write error rate and a breakdown bit error rate according to a second embodiment.

FIG. 9 represents an example of a bit error rate Rb for a write voltage.

Since the write error rate that is equal to or smaller than $10^{-6}$ is not acquired from a measurement, the measurement result is calculated by extrapolating the measurement result as a straight line.

Here, a solid line 62 represents a write error rate, and a broken line 63 represents a breakdown bit error rate Rb.

The breakdown bit error rate Rb can be acquired by determining a Weibull distribution and parameters of a power law model through a regular stress test in which a time is measured until the breakdown of the memory device 2 by applying a constant voltage to a plurality of memory devices 2. In this figure, the write error rate appears to decrease as the write voltage is increased. On the contrary, the breakdown bit error rate Rb appears to increase as the write voltage is increased.

In FIG. 9, it can be known that, for a case where the write voltage is 0.65 V, the write error rate is "−4", in other words, only one operation out of 10,000 operations is failed. However, in order not to apply stress to the memory device 2 as possibility as can be, the write voltage is preferably low. Accordingly, in this example, the initial value of the write voltage is set to be low, and, in a case where the write operation is failed, the write voltage is gradually raised, and the write operation is performed again.

Figure 10:
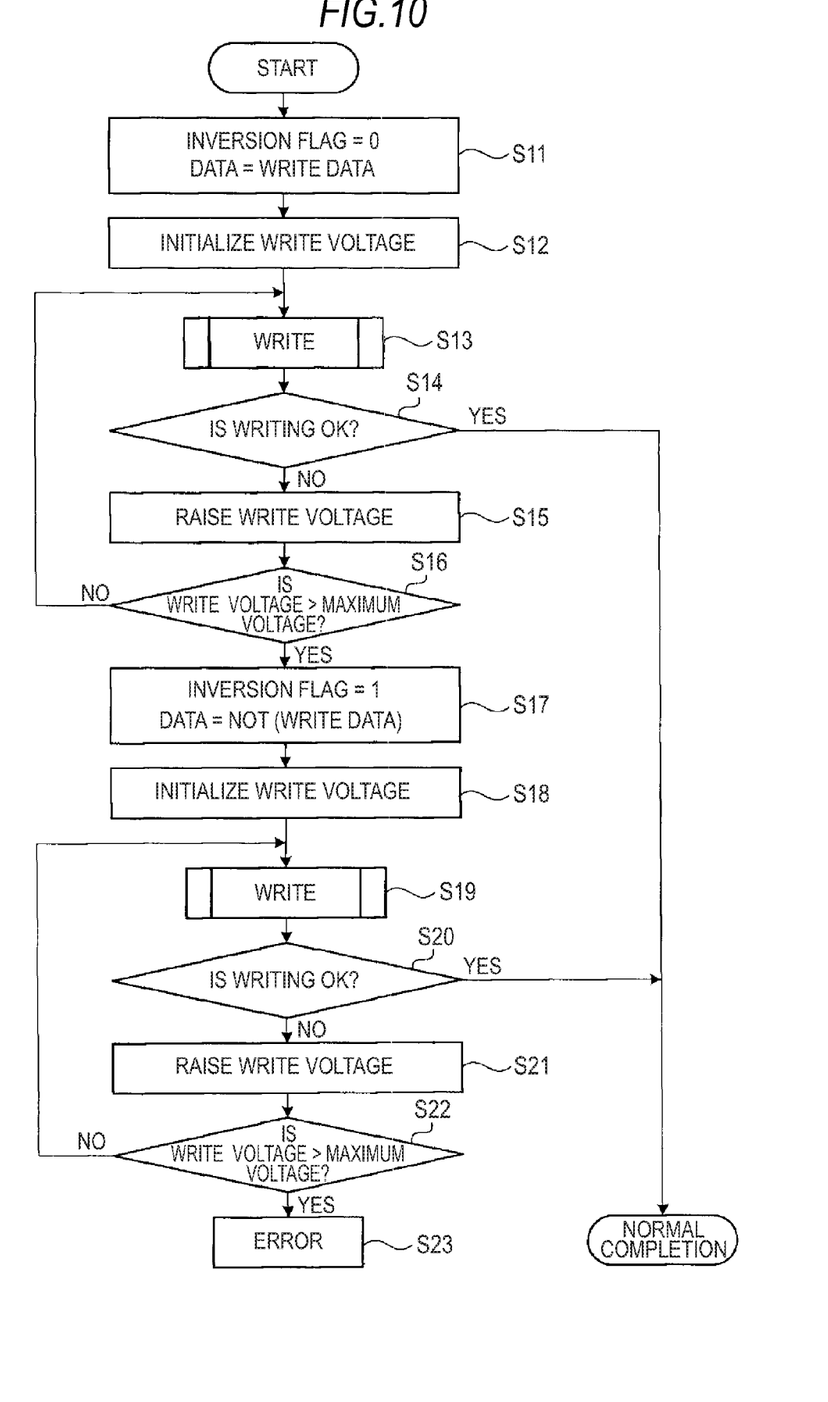
FIG. 10 is a flowchart of a writing method according to the second embodiment.

FIG. 10 represents a flowchart for a case where data is written into the memory device 2.

First, writing data into the memory block 40 is tried in accordance with a write voltage that is supplied from the voltage control unit 11 without using the inversion flag device 41 (Step S11). In other words, the data to be written into the inversion flag device 41 is set to "0", and the write data to be written into the data devices 40a to 40h is set without any change.

Next, the write voltage is set to the initial value (Step S12), and the write unit performs an actual write operation for the memory block 40 in accordance with a write voltage that is supplied from the voltage control unit 11 (Step S13). Next, the sense amplifier 10 reads out data and determines whether desired data is written (Step S14).

When verifying that the desired data is written, the sense amplifier 10 completes the write operation. On the other hand, when determining that data of one bit or more is not correctly written, the sense amplifier 10 raises the write voltage (Step S15) and determines whether the raised write voltage exceeds an allowed maximum value (Step S16). In a case where the raised write voltage does not exceed the allowed maximum value, the process proceeds to Step S13, and the write unit writes the data again. The write unit repeats this loop until the write voltage reaches the maximum voltage.

Here, in this example, the maximum voltage is assumed to be 0.70 V. This value, as shown in FIG. 9, corresponds to the intersection of the solid line 62 representing the write error rate and the broken line 63 representing the breakdown bit error rate Rb. Then, when the write voltage exceeds the maximum voltage, the breakdown bit error rate Rb becomes higher than the write error rate. Accordingly, the upper limit of the write voltage is set to the maximum voltage.

In a case where data is not correctly written even during the loop, the sense amplifier 10 determines that a defective device is generated in the memory block 40, and the process proceeds to a write operation using the inversion flag device 41. In other words, the write data to be written into the inversion flag device 41 is set to "1", and the data to be written into the data devices is set to data acquired by shifting from "0" to "1" and from "1" to "0" in desired data (Step S17).

Again, after the write voltage is set to the initial value (Step S18), the write unit performs an actual write operation for the memory block 40 in accordance with the write voltage that is supplied from the voltage control unit 11 (Step S19). Next, the sense amplifier 10 reads out the data and determines whether or not the desired data is written (Step S20). When verifying that the desired data is written, the sense amplifier 10 completes the write operation.

On the other hand, when determining that data of one bit or more is not correctly written, the sense amplifier 10 raises the write voltage (Step S21) and determines whether the raised write voltage exceeds the allowed maximum value (Step S22). In a case where the raised write voltage does not exceed the allowed maximum value, the process proceeds to Step S19, and the write unit writes the data again. The write unit repeats this loop until the write voltage reaches the maximum voltage.

In a case where data is not written even when the write voltage reaches the maximum voltage, an error is determined (Step S23). At this time, the writing of correct data is given up, and aid using the ECC is expected.

In addition, in a case where the number of bits that are not correctly written at a time when the inversion flag device 41 is "0" is smaller than the number of bits that are not correctly written at a time when the inversion flag device 41 is "1", the inversion flag device 41 is set to "0" again. Then, it may be configured that the data desired to be written is set without any change, and the data is written into the data devices 40a to 40h.

According to the above-described second embodiment, in a case where data is not written at the write voltage set as the initial value, the write voltage is raised until it reaches the maximum voltage, whereby the data can be assuredly written into the memory devices 2. Here, even when the write voltage is set to the initial value, a write operation can be performed at the probability of about one failure out of 10,000 operations. Accordingly, the voltage applied to the memory devices 2 is low, and breakdown of the memory devices 2 can be prevented. In addition, in a case where the writing is failed, the success rate of the write operation can be raised by raising the voltage. As described above, the writing of data can be performed with decreasing the stress applied to the memory devices 2 as possibly as can be. Accordingly, there is an advantage in that the period during which the SpRAM1 can be used is extended.

3. Modified Examples

In addition, the technology relating to an embodiment of the present invention is not limited to be applied to the SpRAM1. Thus, the above-described technology can be applied to a memory of a different type as long as a defective device is generated therein. The factor causing generation of defects in the memory device 2 may be any factor such as low resistance of the memory device, similar to the case of the SpRAM1, or high resistance of the memory device.

In addition, the data processing method according to the above-described embodiment is a writing method configured in consideration of the SpRAM1. Thus, when the embodiment is applied to a memory of a different type, the "write voltage" may be replaced with an appropriate amount of a write operation.

In addition, in the memory device 2 according to the above-described embodiments, the magnetization fixed layer 15 is formed on a lower layer of the memory layer 16. However, a configuration in which the magnetization fixed layer is formed on an upper layer of the memory layer may be used. In addition, in the above-described embodiments, the magnetization fixed layer 15 is configured by two layers of the ferromagnetic layers 22 and 24. However, the number of the ferromagnetic layers configuring the magnetization fixed layer 15 is not particularly limited.

In addition, in this embodiment, the magnetization fixed layer 15 is formed only on a lower layer of the memory layer 16. However, a configuration in which a different magnetization fixed layer is formed on an upper layer of the memory layer 16, and the memory layer is interposed between the two magnetization fixed layers may be used. At this time, the direction of magnetization of a layer of the ferromagnetic layers, which configures the different magnetization layer, located closest to the memory layer is preferably fixed in a direction opposite to the direction of magnetization of the ferromagnetic layer 24 configuring the magnetization fixed layer 15. In addition, the layer that separates the different magnetization fixed layer from the memory layer 16 may be an insulating body, similarly to the tunnel insulating layer 25, or may be nonmagnetic metal such as Ru, Ta, Cr, or Cu.

The present invention is not limited to the above-described configurations and may have various different configurations within the scope not departing from the basic concept of the present invention.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention claimed is:

1. A memory comprising:
   memory devices that each store data of one bit; and
   a read unit that, by using one predetermined memory device of the memory devices that are included in a memory block having a predetermined unit number of the memory devices as an inversion flag device, is configured to:
   read out data of (the predetermined unit number −1) bits that is written in the other memory devices with the bits being inverted in a case where the data of one bit written in the inversion flag device is a first value representing any one of "0" and "1", wherein the first value is written in the inversion flag device after at least one of the other memory devices is determined to be defective; and
   directly read out the data of (the predetermined unit number −1) bits that is written in the other memory devices in a case where the data of one bit written in the inversion flag device is a second value other than the first value.

2. The memory according to claim 1, further comprising:
   a write unit that writes the data of (the predetermined unit number −1) bits into the other memory devices with the bits being inverted in a case where the first value is written in the inversion flag device, and writes the data of (the predetermined unit number −1) bits without any change in the other memory devices in a case where the second value is written in the inversion flag device; and
a voltage control unit that controls a write voltage used for writing data into the memory block by the write unit.

3. The memory according to claim 2,
wherein the read unit, in a case where the write unit writes data into the memory blocks for a first time, writes the second value into the inversion flag device, writes the data of (the predetermined unit number −1) bits without any change in the other memory devices, and directly reads out the data of (the predetermined unit number −1) written in the other memory devices from the memory block, and
wherein the read unit completes the writing of data that is performed by the write unit in a case where the data of (the predetermined unit number −1) bits is determined to be correctly written into the other memory devices as a result of the directly reading out of the data of (the predetermined unit number −1) bits, and writes the first value into the inversion flag device and directs the write unit to write the data of (the predetermined unit number −1) bits in the other memory devices at least once or more with the bits being inverted in a case where data of one bit or more is determined to be defective by not being correctly written.

4. The memory according to claim 3,
wherein the read unit directs the voltage control unit to increase the write voltage and to allow the write unit to write data again in a case where data of one bit or more is determined not to be correctly written as the result of directly reading out the data of (the predetermined unit number −1) bits written in the other memory devices from the memory block.

5. The memory according to claim 1, wherein the memory device stores data of one bit in accordance with a change in resistance by writing the data of one bit using the write unit.

6. The memory according to claim 5,
wherein the memory device includes:
a memory layer that stores data as a magnetization state of a magnetic body; and
a magnetization fixed layer, of which a direction of magnetization is fixed, with a nonmagnetic layer interposed between the magnetization fixed layer and the memory layer, and
wherein the direction of magnetization of the memory layer is changed so as to store data in the memory layer by applying a write current flowing in a stacked direction.

7. The memory according to claim 1, wherein the read unit uses an error correction code to read out the data of (the predetermined unit number −1) bits when at least two of the memory devices are determined to be defective.

8. The memory according to claim 1, wherein the first value is written in the inversion flag device after at least one of the other memory devices is determined to be defective only when data to be written to the defective memory devices is to have a value of "1".

9. A data processing method comprising the steps of:
reading out, in a case where data of one bit written in an inversion flag device is a first value representing any one of "0" and "1" with one predetermined memory device of a memory block, which includes a predetermined unit number of the memory devices each storing data of one bit, used as the inversion flag device, data of (a predetermined unit number −1) bits written in the other memory devices with the bits being inverted, wherein the first value is written in the inversion flag device after at least one of the other memory devices is determined to be defective; and
directly reading out the data of (the predetermined unit number −1) bits written in the other memory devices in a case where the data of one bit written in the inversion flag device is a second value other than the first value.

* * * * *